United States Patent [19]

Daniel et al.

[11] 4,243,955

[45] Jan. 6, 1981

[54] REGULATED SUPPRESSED CARRIER MODULATION SYSTEM

[75] Inventors: Sam M. Daniel; Kenneth M. Peterson, both of Tempe, Ariz.

[73] Assignee: Motorola, Inc., Schaumburg, Ill.

[21] Appl. No.: 920,048

[22] Filed: Jun. 28, 1978

[51] Int. Cl.³ ............................ H03C 1/52; H04B 1/12
[52] U.S. Cl. ................................. 332/37 D; 332/44;
455/109; 455/116; 455/126; 455/303
[58] Field of Search ............. 325/123, 124, 138, 144,
325/159, 139, 187, 49, 472–475, 323; 332/37 R,
37 D, 44; 455/46, 109, 114, 116, 119, 126, 295,
302–305

[56] References Cited

U.S. PATENT DOCUMENTS

| | | | |
|---|---|---|---|
| 3,229,230 | 1/1966 | Feldman | 325/138 |
| 3,358,234 | 12/1967 | Stover | 325/49 |
| 3,384,840 | 5/1968 | Holsinger | 325/138 |
| 3,500,250 | 3/1970 | Frerking | 325/138 |
| 4,105,977 | 8/1978 | Fitting et al. | 328/166 |

*Primary Examiner*—Marc E. Bookbinder
*Attorney, Agent, or Firm*—Eugene A. Parsons

[57] ABSTRACT

A method and apparatus for suppressing carrier leakage components in a system for modulating a carrier with a selected signal wherein the carrier and a quadrature component of the carrier are weighted and summed with the modulated carrier to produce a component substantially equal and opposite in phase to the leakage component so that the summing substantially cancels or suppresses the leakage component.

14 Claims, 5 Drawing Figures

REGULATED SUPPRESSED CARRIER MODULATION SYSTEM

BACKGROUND OF THE INVENTION

Carrier feedthrough is a common limitation in suppressed carrier modulators. This phenomenon is a limiting factor in the amount of processing gain that can be achieved by systems attempting to separate desired signals from undesired or interferring signals. In the prior art, attempts have been made to eliminate the carrier feedthrough by precise filtering or by predicting the feedthrough signal and combining the predicted signal with the output to eliminate or subtract the feedthrough signal from the output signal as described in U.S. Pat. No. 3,633,117, entitled "Suppression of a Phase-Sensitive Spectral Component From a Signal," and issued Jan. 4, 1972. In general, the methods and apparatus for performing these prior art attempts to eliminate the carrier feedthrough are less than adequate.

SUMMARY OF THE INVENTION

The present invention pertains to regulated suppressed carrier modulation systems and methods substantially eliminating carrier signal feedthrough by providing first and second substantially quadrature carrier signals with the selected modulating signal, modulating either the first or the second carrier signal with the selected modulating signal, weighting the first and second carrier signals individually in accordance with developed control signals to produce signals substantially equal and opposite in phase to carrier feedthrough components, and summing the modulated signal, the weighted first carrier signal and the weighted second carrier signal to substantially eliminate the feedthrough components.

It is an object of the present invention to provide a new and improved regulated suppressed carrier modulation apparatus for modulating a carrier signal with a selected signal and substantially eliminating carrier signal feedthrough.

It is a further object of the present invention to provide new and improved regulated suppressed carrier modulation apparatus and method for producing first and second carrier signal components equal and opposite to carrier leakage components present in the output of the modulator and summing the produced components with the output signal from the modulator to provide a substantially pure modulated carrier signal with carrier signal feedthrough substantially eliminated.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
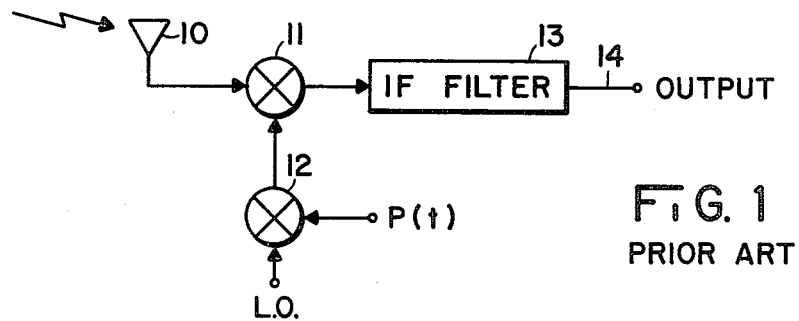
FIG. 1 is a schematic diagram of a simplified receiver incorporating a prior art phase modulaton system.

The performance of systems using suppressed carrier modulation is often limited by how well carrier suppression is maintained. This is particularly true of spread spectrum systems using direct sequence psuedo-noise modulation. In such systems the lack of carrier suppression manifests itself most seriously at the receiving end of the communication link. FIG. 1 illustrates a simplified receiver for receiving a desired signal modulated with a selected signal, such as psuedo random noise or some other selected sequence, and, possibly, an interference signal, such as a continuous wave jamming signal. This invention will be described using a psuedo random noise signal, $P(t)$, as the selected signal and a continuous wave jamming signal, $J \sin (\omega_{IF}+\omega_{LO})t$, as the interference signal, but it should be understood that these signals are used only for exemplary purposes and are not intended to limit the scope of the invention. As will also be understood by those skilled in the art, a pseudo-random noise signal is a biphase signal ($\pm 1$, or 0 or 180°) so that the present embodiment discloses phase modulation but other forms of modulation (by using other types of signals) may be utilized if desired.

An antenna 10 receives the desired signal and the CW jamming signal represented by $$P(t) \sin (\omega_{IF}+\omega_{LO})t + J \sin (\omega_{IF}+\omega_{LO})t$$

This signal is supplied to a first input of a mixer 11. A second input of the mixer 11 receives an output signal $$P(t) \sin \omega_{LO}t + \epsilon \sin \omega_{LO}t$$

from a modulator 12 having a first input connected to receive a local oscillator signal, L.O., and a second input connected to receive a selected modulating signal, $P(t)$. The term, $\omega$, represents the carrier leakage inherent in the receiver local oscillator modulator 12. The output of the mixer 11 is supplied through an IF filter 13 to an output 14. It is clear that because of the presence of the leakage term, $\omega$, the interference signal, J, will be present in the receiver IF along with the desired signal, $\cos \omega_{IF}t$, and other cross terms indicated by the following $$\cos \omega_{IF}t + \epsilon J \cos \omega_{IF}t + P(t)J \cos \omega_{IF}t + \epsilon P(t) \cos \omega_{IF}t$$

The amount of processing gain against such an interference signal is limited to $-20 \text{ Log } \epsilon$ whenever $\epsilon$ is sufficiently greater than zero. Although this processing gain may be as large as 30 dB, if the absolute amplitude of the most undesired signal, $\epsilon J \cos \omega_{IF}t$, approaches that of the desired signal, bit synchronization may become impossible to achieve or maintain, thus rendering the system inoperable.

Figure 2:
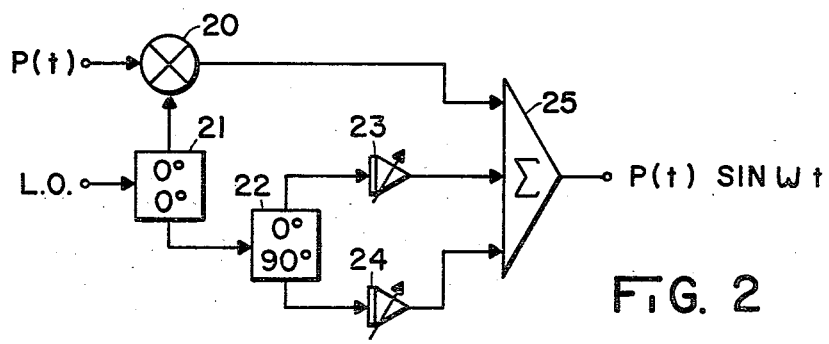
FIG. 2 is a schematic diagram of a regulated suppressed carrier phase modulation system embodying the present invention.

A first embodiment of a regulated suppressed carrier phase modulation system for effecting the cancellation of the undesired carrier leakage is illustrated in FIG. 2. A psuedo random noise signal, $P(t)$, is applied to one input of a modulator 20. A local oscillator signal is applied to a power splitter 21 which supplies the signal in substantially equal amplitudes to a second input of the modulator 20 and an input of a hydbrid quadrature phase splitter 22. The signal at the output of the modulator 20 is:

$$P(t) \sin \omega t + \epsilon \sin (\omega t + \phi)$$

The phase splitter 22 yields nearly orthogonal signals having phase perturbations $\alpha$ and $\beta$ as indicated by $$\sin (\omega t + \beta)$$

$$\cos (\omega t + \alpha)$$

The latter two signals are supplied through two adjustable bipolar amplifiers or weighters, 23 and 24, respectively, to a summing device 25 where they are summed with the output signal of the modulator 20. While a device for adding signals is shown, it should be understood that a "summing device" could also include apparatus for subtracting similar signals, etc. Combining these signals in the summing device 25 results in an augmented mixed output signal with a substantially reduced carrier leakage term. It can be shown that manual adjustment of the amplifiers 23 and 24 to values $W_1$ and $W_2$ results in satisfying the matrix equation:

$$\begin{pmatrix} \cos \beta & -\sin \alpha \\ \sin \beta & \cos \alpha \end{pmatrix} \begin{pmatrix} W_1 \\ W_2 \end{pmatrix} = -\epsilon \begin{pmatrix} \cos \phi \\ \sin \phi \end{pmatrix}$$

yielding weights $$\begin{pmatrix} W_1 \\ W_2 \end{pmatrix} = \frac{-\epsilon}{\cos (\beta - \alpha)} \begin{pmatrix} \cos (\phi - \alpha) \\ \sin (\phi - \beta) \end{pmatrix}$$

which are capable of completely cancelling the carrier leakage term when $\epsilon$ and $\phi$ are constant.

Figure 3:
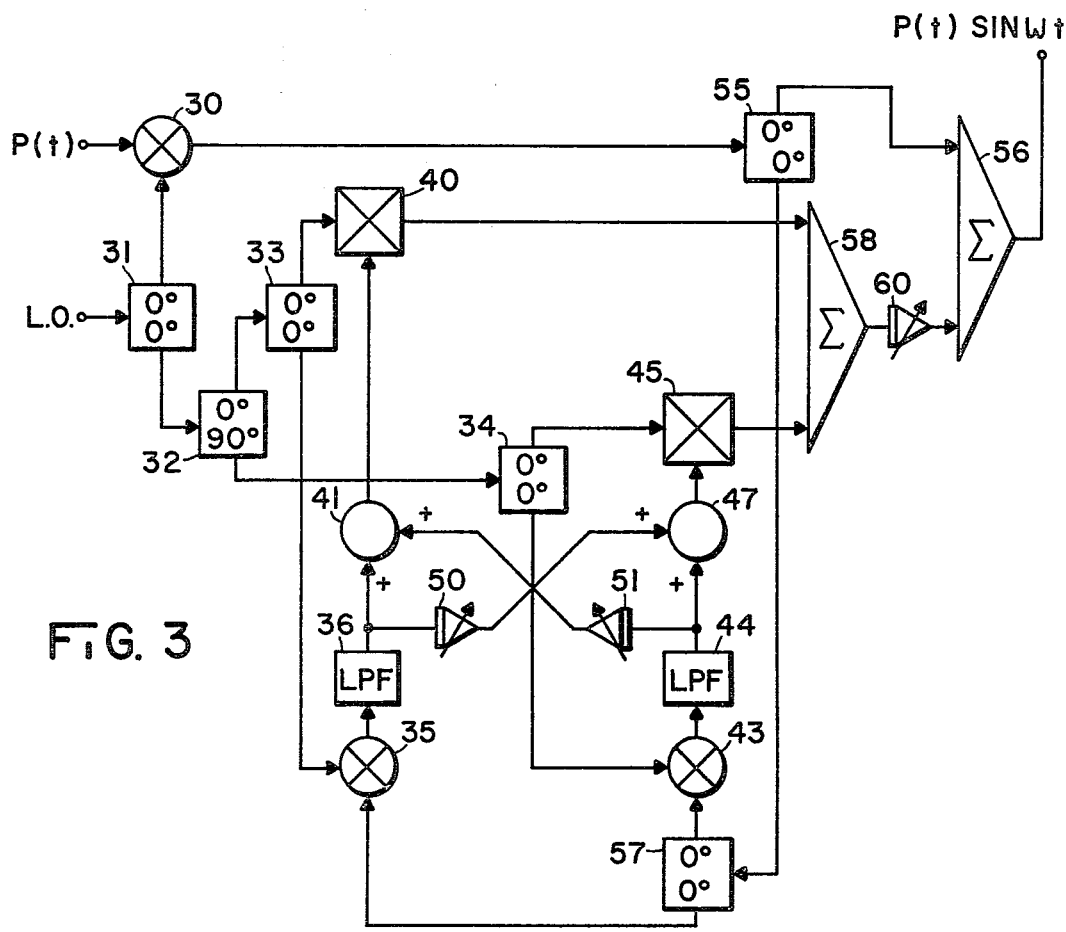
FIG. 3 is a schematic diagram of another regulated suppressed carrier phase modulation system embodying the present invention.

The previous open loop method is adequate when $\epsilon$ and $\phi$ are fixed. If, however, $\epsilon$ and $\phi$ should vary with time, the simple open loop will be inadequate for properly cancelling the carrier leakage term. FIG. 3 illustrates a correlation-directed open loop configuration appropriate for variable $\epsilon$ and $\phi$. In this embodiment the psuedo random noise signal, P(t), is applied to an input of a modulator 30. A local oscillator signal is applied to a power splitter 31 which supplies the signal in substantially equal amplitudes to a second input of the modulator 30 and an input of a hybrid quadrature phase splitter 32. In the present embodiment (and all other embodiments) the phase splitter 32 is illustrated as providing a first 0°, or inphase signal, and a second 90°, or quadrature signal, but it should be understood that substantially any device providing nearly orthogonal signals (regardless of the actual phase) might be utilized. The first and second output signals from the phase splitter 32 are applied to power splitters 33 and 34, respectively. One output of the power splitter 33 is applied to an input of correlation means, including a mixer 35 and a low pass filter 36, and a second output is applied to an input of a multiplying device (or weighting means) 40. The output of the filter 36 is applied through a combining device 41 to a second input of the multiplying device 40. One output of the power splitter 34 is applied to an input of correlation means, including a mixer 43 and a low pass filter 44, and a second output is applied to an input of a multiplying device (or weighting means) 45. The output of the filter 44 is applied through a combining device 47 to a second input of the multiplying device 45. The output of the filter 36 is also supplied through an adjustable bipolar amplifier 50 to a second input of the combining device 47, and the output of the filter 44 is supplied through an adjustable bipolar amplifier 51 to a second input of the combining device 41. The multiplying devices 40 and 45 may be any devices which will multiply the relatively high frequency L.O. signals by the very low frequency (substantially DC) control signals, e.g. bipolar voltage controlled amplifiers, current controlled pin diodes, balanced modulators operating as attenuators, etc. The output of the modulator 30 is applied through a power splitter 55 to one input of a summing device 56. The power splitter 55 also supplies the output of the modulator 30 through a power splitter 57 to second inputs of the mixers 35 and 43. The outputs of the multiplying devices 40 and 45 are applied to a summing device 58, the output of which is applied through an adjustable bipolar amplifier 60 to a second input of the summing device 56.

In this configuration, the inphase and quadrature correlations of the output signal of modulator 30 are derived and are used as control signals to weight the inphase and quadrature LO outputs before precombining in the first summing device 58 which, upon weighting with amplifier 60, is combined with the output signal of modulator 30 via the second summing device 56, thereby producing a final mixed signal with a substantially reduced carrier leakage term. The inphase correlation, $W_1'$ (output of filter 36), and the quadrature correlation, $W_2'$ (output of filter 44), are given by:

$$\begin{pmatrix} W_1' \\ W_2' \end{pmatrix} = \frac{\epsilon}{2} \begin{pmatrix} \cos (\phi - \beta) \\ \sin (\phi - \alpha) \end{pmatrix}$$

The inphase and quadrature control signals, $W_1$ and $W_2$, are derived via the decoupling network, combining devices 41 and 47 and amplifiers 50 and 51. Specifically, they are identical to the open loops signals of FIG. 2 when $$S = \sin (\beta - \alpha)$$

$$G = \frac{-2}{1 - S^2}$$

where S is the gain of the amplifiers 50 and 51 and G is the gain of the amplifier 60, which gains are manually adjusted. In this embodiment, the manually adjusted gains S and G are not dependent on $\epsilon$ and $\phi$ but, rather, on essentially constant phase shifts $\beta$ and $\alpha$. Another advantage in this implementation is that it is not necessary to insert amplification within the inphase and quadrature loops. Finally, with the G as defined above, the carrier leakage cancellation, is complete for varying $\epsilon$ and $\phi$.

Figure 4:
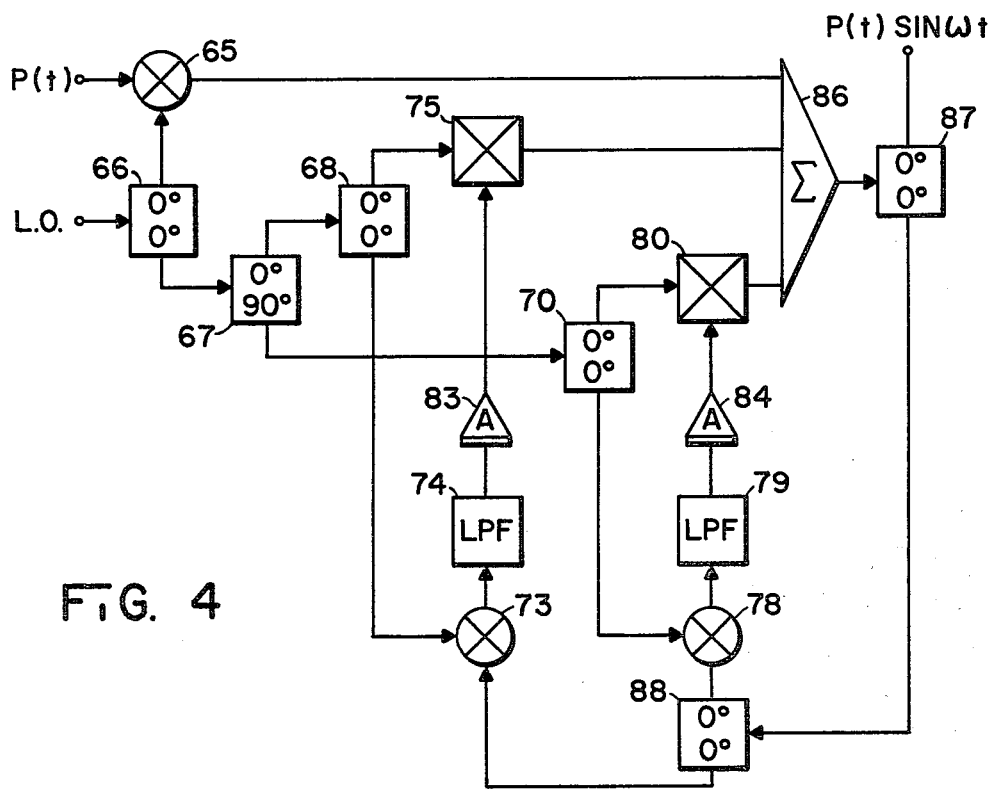
FIG. 4 is a schematic diagram of a self regulating suppressed carrier phase modulation system embodying the present invention.

FIG. 4 illustrates a basic block diagram of an adaptive, or self regulating, system for cancelling the carrier leakage component. The selected modulating signal, P(t) is received at a terminal connected to one input of a modulator 65. A local oscillator, or carrier, LO, is received at a terminal connected to an input of a power splitter 66. One output terminal of the power splitter 66 is connected to a second input terminal of the modulator 65 and a second output terminal is connected to an input terminal of a quadrature phase splitter 67. The first output (the inphase output in this embodiment) of the hybrid phase splitter 67 is connected to the input terminal of a power splitter 68 and the second output (the quadrature output in this embodiment) is connected to the input terminal of a power splitter 70. One output of the power splitter 68 is connected to an input of a first correlator, including a mixer 73 and low pass filter 74, and the second output is connected to an input of a multiplying device (or weighting means) 75. One output of the power splitter 70 is connected to an input of a second correlator, including a mixer 78 and low pass filter 79, and the second output is connected to an input of a multiplying device (or weighting means) 80. The output of the filter 74 is connected through a high gain amplifier 83 to a second input of the multiplying device 75 and the output of the filter 79 is connected through a high gain amplifier 84 to a second input of the multiplying device 80. The outputs of the modulator 65 and the multiplying devices 75 and 80 are connected to three inputs of a summing device 86, the output of which is connected to the input of a power splitter 87. One output of the power splitter 87 provides the output of the system and the other output is connected to the input of a power splitter 88. The outputs of the power splitter 88 are connected to second inputs of mixers 73 and 78, respectively.

In contrast to the correlation-directed open loop configuration of FIG. 3 where a manually adjusted gain must be provided, which for practical reasons may drift somewhat, the closed loop embodiment of FIG. 4 circumvents the need to rely on such an adjustment. It can be shown that, at steady state, the first and second correlaton outputs (outputs of filters 74 and 79), $W_1$ and $W_2$, satisfy equations $$W_1 = (A/2)[W_1 + W_2 \sin(\beta - \alpha) + \epsilon \cos(\phi - \beta)]$$

$$W_2 = (A/2)[W_1 \sin(\beta - \alpha) + W_2 + \epsilon \sin(\phi - \alpha)]$$

which implies the matrix equation $$\begin{pmatrix} 1 & RS \\ RS & 1 \end{pmatrix} \begin{pmatrix} W_1 \\ W_2 \end{pmatrix} = -\epsilon R \begin{pmatrix} \cos(\phi - \beta) \\ \sin(\phi - \alpha) \end{pmatrix}$$

where $$R = \frac{-A/2}{1 - A/2}$$

$$S = \sin(\beta - \alpha)$$

Finally, the solution to the above matrix equation is $$\begin{pmatrix} W_1 \\ W_2 \end{pmatrix} = \frac{-\epsilon R}{1 - R^2 S^2} \begin{pmatrix} \cos(\phi - \beta) - RS \sin(\phi - \alpha) \\ -RS \cos(\phi - \beta) + \sin(\phi - \alpha) \end{pmatrix}$$

Unlike the two open loop configurations of FIGS. 2 and 3, the cancellation that results in this configuration is not complete. In fact, it can be shown that the residual carrier leakage power, P, is given by $$P = (\epsilon \cos \phi + W_1 \cos \beta - W_2 \sin \alpha)^2 + (\epsilon \sin \phi + W_1 \sin \beta + W_2 \cos \alpha)^2$$
$$= \tfrac{1}{2}[\epsilon^2 + W_1^2 + W_2^2 + 2\epsilon W_1 \cos(\phi - \beta) + 2\epsilon W_2 \sin(\phi - \alpha) + 2W_1 W_2 \sin(\beta - \alpha)]$$

Examining the solution of the matrix equation above, we see that for $\alpha = \beta$ the weights, $W_1$ and $W_2$, are proportional to R. The cancellation is complete only when R is unity. However, as can be seen from the equation defining R, since R can be set to unity only in the limit as $A \to \infty$, it is impractical to achieve perfect cancellation. Besides, A may not be set arbitrarily too high without inducing oscillations due to accompanying band limiting. It has been found that adequate cancellation for most applications can be attained when the amplifiers 83 and 84 have a gain of approximately 40 dB.

Figure 5:
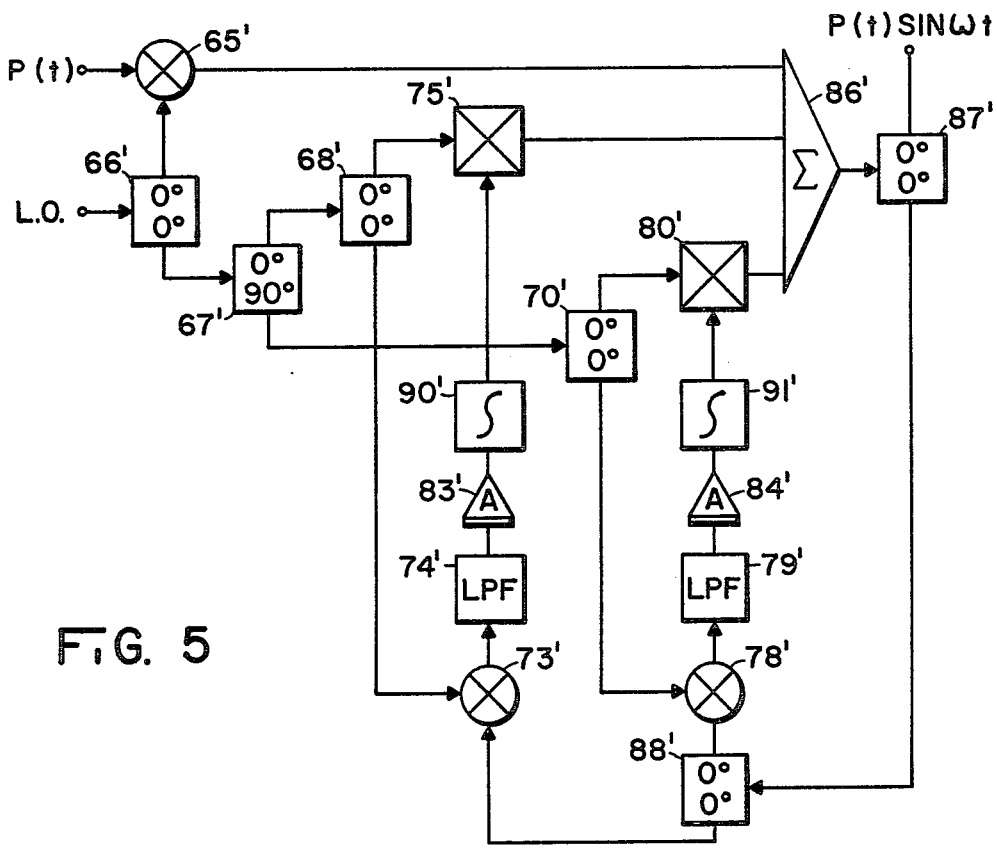
FIG. 5 is a schematic diagram of another embodiment of a self regulating suppressed carrier phase modulation system embodying the present invention.

Referring to FIG. 5, a second closed loop embodiment of an adaptive system for cancelling the carrier leakage component is illustrated. The system of FIG. 5 is similar to FIG. 4. and similar components have been designated with similar numbers, with all of the numbers having a prime added to indicate that it is another embodiment. As can be seen from a comparison of FIGS. 4 and 5, the difference therebetween lies in the addition of integrators 90' and 91' to the first and second loops, between the outputs of the amplifiers 83' and 84' and the multiplying devices 75' and 80', respectively. Because of the addition of the integrators 90' and 91', the gains A in each of the loops are not required to be large and, in fact, must be bounded by reciprocal first and second loop power, namely, $$A \leq \frac{1}{P_1 + P_2} \approx 1$$

provided that any losses in the preceding first and second correlations are compensated. The gain, A, will guarantee stability of this closed loop control system. For example, with losses, a gain of approximately 0 dB in amplifiers 83' and 84' was found to be adequate.

In the steady state, the resultant weights satisfy the following matrix equation $$\begin{pmatrix} 1 & S \\ S & 1 \end{pmatrix} \begin{pmatrix} W_1 \\ W_2 \end{pmatrix} = -\epsilon \begin{pmatrix} \cos(\phi - \beta) \\ \sin(\phi - \alpha) \end{pmatrix}$$

where
$$S = \sin(\beta - \alpha)$$

The solution for these weights is $$\begin{pmatrix} W_1 \\ W_2 \end{pmatrix} = \frac{-\epsilon}{1 - S^2} \begin{pmatrix} \cos(\phi - \beta) - S \sin(\phi - \alpha) \\ -S \cos(\phi - \beta) + \sin(\phi - \alpha) \end{pmatrix}$$

which may be simplified to $$\begin{pmatrix} W_1 \\ W_2 \end{pmatrix} = \frac{-\epsilon}{\cos(\beta - \alpha)} \begin{pmatrix} \cos(\phi - \alpha) \\ \sin(\phi - \beta) \end{pmatrix}$$

precisely the result obtained in the embodiment of the open loop of FIG. 2. The weights given by the above equation account for perfect cancellation of the carrier leakage component.

Thus, two open loop and two closed loop embodiments of the regulated suppressed carrier phase modulation system are illustrated and described. Each of these embodiments has some specific advantages, e.g. simplicity, operating conditions, amount of cancellation, etc., but each of them will provide substantial cancellation of the carrier leakage component. Generally, this cancellation will be sufficient to substantially affect the amount of processing gain that can be achieved in systems attempting to separate desired signals from undesired or interferring signals. While each of these embodiments illustrate specific connections, e.g. an in phase carrier component connected for modulation, it should be understood that these connections could be reversed by one skilled in the art and such changes, along with required modifications, would be well within the purview of one skilled in the art and the scope of this invention.

While we have shown and described four specific embodiments of the present invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. Regulated suppressed carrier modulator apparatus for modulating a carrier signal with a selected signal and substantially eliminating carrier signal feedthrough, said apparatus comprising:
    (a) phase shifting means coupled to receive the carrier signal and provide, at two output terminals, first and second versions of the carrier signal with a phase difference of approximately 90°;
    (b) multiplying means having a first input connected to receive the selected signal, a second input coupled to said phase shifting means to receive one of the first and second versions of the carrier, and an output;
    (c) first and second weighting means each having a signal input coupled to a different output terminal of said phase shifting means to receive one of the first and second versions of the carrier, an output, and means for controlling the weighting means for providing signals at the outputs thereof which, when combined, have a value substantially equal to the carrier signal feedthrough; and
    (d) combining means coupled to the outputs of said multiplying means and said first and second weighting means and combining the signals applied thereto in a manner to substantially suppress the carrier signal at an output thereof.

2. Regulated suppressed carrier modulator apparatus as claimed in claim 1 wherein the first and second weighting means each include an adjustable bipolar amplifier.

3. Regulated suppressed carrier modulator apparatus as claimed in claim 1 wherein the carrier signal is supplied by a local oscillator.

4. Regulated suppressed carrier modulator apparatus as claimed in claim 3 wherein the selected signal is a psuedo random signal.

5. Regulated suppressed carrier modulator apparatus for modulating a carrier signal with a selected signal and substantially eliminating carrier signal feedthrough, said apparatus comprising:
    (a) phase shifting means coupled to receive the carrier signal and provide first and second versions of the carrier signal with a phase difference of approximately 90°;
    (b) first multiplying means having a first input connected to receive the selected signal, a second input coupled to said phase shifting means to receive one of the first and second versions of the carrier, and an output;
    (c) first weighting means having a signal input connected to said phase shifting means to receive the one of the first and second versions of the carrier, a control signal input, and an output;
    (d) second weighting means having a signal input connected to said phase shifting means to receive the other of the first and second versions of the carrier, a control signal input, and an output;
    (e) summing means connected to the outputs of said first multiplying means and said first and second weighting means and providing at an output thereof a signal modulated with the selected signal with carrier signal feedthrough substantially suppressed;
    (f) first and second correlating means each having a first input coupled to the output of said summing means, a second input, and an output, the second input of said first correlating means being coupled to receive the one of the first and second versions of the carrier and the second input of said second correlating means being coupled to receive the other of the first and second versions of the carrier; and
    (g) amplifying means coupled to receive the output signals from said first and second correlating means and supply an amplified output signal from said first correlating means to the control input of said first weighting means to complete a first control loop and an amplified output signal from said second correlating means to the control input of said second weighting means to complete a second control loop.

6. Regulated suppressed carrier modulator apparatus as claimed in claim 5 wherein the first and second weighting means include balanced modulators operating as attenuators.

7. Regulated suppressed carrier modulator apparatus as claimed in claim 6 wherein the amplifying means include first and second relatively high gain amplifiers.

8. Regulated suppressed carrier modulator apparatus as claimed in claim 6 wherein the open loop gain constant of each of the loops containing the first and second amplifiers is at least 100.

9. Regulated suppressed carrier modulator apparatus as claimed in claim 5 wherein the first and second correlating means each include multipliers and low pass filters.

10. Regulated suppressed carrier modulator apparatus as claimed in claim 5 including in addition integrating means coupled to the amplifying means and the first and second weighting means for integrating the amplified output signals before supplying them to said first and second weighting means.

11. Regulated suppressed carrier modulator apparatus as claimed in claim 10 wherein the amplifying means includes first and second relatively low gain amplifiers.

12. A method of regulating modulator apparatus to substantially eliminate carrier signal feedthrough, said method comprising the steps of:
    (a) providing first and second substantially orthogonal versions of a carrier signal;
    (b) modulating one of the first and second versions of the carrier with a selected modulating signal;

(c) weighting portions of the first and second versions of the carrier so that a combined value of the first and second versions of the carrier is substantially equal to the carrier signal feedthrough; and (d) combining the modulated signal and the weighted first and second versions of the carrier to provide an output signal wherein carrier signal feedthrough is substantially suppressed.

13. A method of regulating modulator apparatus to substantially eliminate carrier signal feedthrough, said method comprising the steps of:

(a) providing first and second versions of a carrier signal, separated in phase by approximately 90°, and a selected modulating signal;

(b) modulating one of the carrier versions with the selected modulating signal;

(c) weighting the first and second versions of the carrier individually in accordance with developed control signals;

(d) summing the modulated signal, the weighted first carrier version and the weighted second carrier version;

(e) correlating the first carrier version with the sum of the signals and amplifying the resulting correlation to produce a first control signal;

(f) correlating the second carrier version with the sum of the signals and amplifying the resulting correlation to produce a second control signal; and (g) controlling the weighting of the first and second control signals to determine the weighting of the first and second versions of the carrier.

14. A method as claimed in claim 13 wherein the steps of correlating include multiplying the first carrier version and the sum of the signals, and multiplying the second carrier version and the sum of the signals and selecting the low side, or difference between the signals.

* * * * *